United States Patent
Minami et al.

(10) Patent No.: US 8,717,737 B2
(45) Date of Patent: May 6, 2014

(54) SUBSTRATE CONVEYANCE METHOD AND SUBSTRATE CONVEYANCE SYSTEM

(75) Inventors: Hirofumi Minami, Kanagawa (JP); Kazuhiro Musha, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 0 days.

(21) Appl. No.: 13/812,745

(22) PCT Filed: Jul. 25, 2011

(86) PCT No.: PCT/JP2011/004163
§ 371 (c)(1),
(2), (4) Date: Feb. 7, 2013

(87) PCT Pub. No.: WO2012/014428
PCT Pub. Date: Feb. 2, 2012

(65) Prior Publication Data
US 2013/0129462 A1    May 23, 2013

(30) Foreign Application Priority Data

Jul. 27, 2010   (JP) .................................. 2010-167746

(51) Int. Cl.
  *H02N 13/00*   (2006.01)
(52) U.S. Cl.
  USPC ......................................................... 361/234
(58) Field of Classification Search
  USPC ......................................................... 361/234
  See application file for complete search history.

(56) References Cited

U.S. PATENT DOCUMENTS

| | | | |
|---|---|---|---|
| 4,962,441 A | 10/1990 | Collins | |
| 5,789,843 A | 8/1998 | Higuchi et al. | |
| 7,624,870 B2 * | 12/2009 | Nishizaka et al. | 206/454 |
| 8,497,476 B2 * | 7/2013 | Hatakeyama et al. | 250/310 |
| 2002/0089655 A1 | 7/2002 | Kida et al. | |
| 2009/0109595 A1 * | 4/2009 | Herchen et al. | 361/234 |
| 2010/0104403 A1 * | 4/2010 | Cho et al. | 414/222.13 |
| 2013/0129462 A1 * | 5/2013 | Minami et al. | 414/751.1 |

FOREIGN PATENT DOCUMENTS

| | | |
|---|---|---|
| JP | 02-288352 A | 11/1990 |
| JP | 04-230051 A | 8/1992 |
| JP | 05-066022 A | 3/1993 |
| JP | 07-257751 A | 10/1995 |
| JP | 10-092917 A | 4/1998 |
| JP | 11-168132 A | 6/1999 |
| JP | 11-284052 A | 10/1999 |
| JP | 2002-353291 A | 12/2002 |
| JP | 2006-005136 A | 1/2006 |
| JP | 2009-032712 A | 2/2009 |

OTHER PUBLICATIONS

International Search Report in International Application No. PCT/JP2011/004163, filed Jul. 25, 2011.

* cited by examiner

*Primary Examiner* — Ronald W Leja
(74) *Attorney, Agent, or Firm* — Saliwanchik, Lloyd & Eisenschenk (57) ABSTRACT

Disclosed are a substrate conveyance method and substrate conveyance system that are able to quickly transfer a substrate without losing positional accuracy. Using an electrostatic chuck mechanism in the holding of a wafer (W) by the holding surface (210) of a conveyance robot, the wafer (W) is transferred from a supporting surface (303) to the holding surface (210) in the state where an electrostatic attraction force is generated at the holding surface (210). As a result, since it is possible to hold the wafer by means of the electrostatic attraction force starting immediately after the wafer (W) has been transferred to the holding surface (210), it is possible to rapidly execute a wafer (W) conveying operation and thus it is possible to reduce the conveying time of the wafer between processing chambers.

11 Claims, 9 Drawing Sheets

SUBSTRATE CONVEYANCE METHOD AND SUBSTRATE CONVEYANCE SYSTEM

CROSS-REFERENCE TO RELATED APPLICATIONS

This application is the U.S. national stage application of International Patent Application No. PCT/JP2011/004163, filed Jul. 25, 2011, which claims priority to Japanese Application No. 2010-167746, filed Jul. 27, 2010, the disclosures of each of which are incorporated herein by reference in their entirety.

TECHNICAL FIELD

The present invention relates to a wafer conveyance method and a wafer conveyance system applied to delivering/receiving of a wafer between a conveyance robot and processing chambers in a multi-chamber vacuum processing apparatus, for example.

BACKGROUND ART

For example, in the field of manufacturing semiconductor apparatuses, there is known a multi-chamber vacuum processing apparatus in which a plurality of processing chambers are connected in a cluster manner around a conveyance chamber. This kind of vacuum processing apparatus includes a conveyance robot for conveying wafers between the plurality of processing chambers in the conveyance chamber.

Because the conveyance robot typically expands, contracts, rotates, moves up and down, and the like, it is necessary to provide a structure for reducing the displacement of a wafer during such movements. For example, the following Patent Document 1 describes a wafer conveying apparatus including a hand unit having a plurality of slip-proof pads on an upper surface of a support plate for supporting a wafer. Further, Patent Document 2 describes a structural example in which an electrostatic chuck is provided on a surface on which a wafer is mounted on.

Patent Document 1: Japanese Patent Application Laid-open No. 2002-353291
Patent Document 2: Japanese Patent Application Laid-open No. H-05-66022

DISCLOSURE OF THE INVENTION

Problem to be Solved by the Invention

In recent years, in order to increase productivity of a vacuum processing apparatus for producing semiconductor apparatuses, it is required to further increase the wafer conveyance speed between processing chambers. However, according to the structure of Patent Document 1, pads are attached on a wafer when the temperature of the wafer is high, and the positional accuracy may be reduced when transferring the wafer. Meanwhile, the structure of Patent Document 2 requires a predetermined period of time to attract a wafer by means of electrostatic chucking, or to release the wafer, and thus a wafer may not be transferred quickly, which is inconvenient.

In view of the above-mentioned circumstances, an object of the present invention is to provide a wafer conveyance method and a wafer conveyance system that are able to quickly transfer a wafer without losing positional accuracy.

Means for Solving the Problem

To attain this object, a wafer conveyance method according to an embodiment of the present invention includes moving a holding surface of a conveyance robot having an electrode for electrostatic attraction to the vicinity of a wafer supported by a supporting surface of a support member.

The wafer is transferred from the supporting surface to the holding surface while applying a voltage to the electrode.

To attain this object, a wafer conveyance system according to an embodiment of the present invention includes a conveyance robot, a supporting surface, and a controller.

The conveyance robot includes a holding surface having an electrode for electrostatic attraction.

The supporting surface supports a wafer.

The controller is capable of carrying out an operation control for moving the holding surface relative to the supporting surface, and a control for supplying a voltage to the electrode, and is configured to cause the conveyance robot to transfer the wafer from the supporting surface to the holding surface while a voltage is applied to the electrode.

BEST MODES FOR CARRYING OUT THE INVENTION

A wafer conveyance method according to an embodiment of the present invention includes moving a holding surface of a conveyance robot having an electrode for electrostatic attraction to the vicinity of a wafer supported by a supporting surface of a support member.

The wafer is transferred from the supporting surface to the holding surface while applying a voltage to the electrode.

The wafer conveyance method employs an electrostatic chuck mechanism such that the holding surface of the conveyance robot holds the wafer, and the wafer is transferred from the supporting surface to the holding surface while an electrostatic attraction force is generated on the holding surface. Because of this, the wafer may be held by means of an electrostatic attraction force immediately after the wafer is moved to the holding surface, whereby it is possible to convey the wafer rapidly. As a result, it is possible to shorten the time of conveying the wafer between the processing chambers.

The wafer conveyance method may further include transferring the wafer to the supporting surface while the holding surface electrostatically attracts the wafer. According to this method, it is possible to transfer the wafer from the holding surface of the conveyance robot to the supporting surface of the processing stage without losing the positional accuracy of the wafer. As a result, it is possible to further shorten the time of conveying the wafer between the processing chambers. Further, it is possible to omit the time to lose an electrostatic attraction force applied to the wafer, which is required for the method of transferring the wafer after cutting off an electrostatic attraction force supplied to the holding surface, whereby it is possible to transfer the wafer rapidly. As a result, it is possible to further shorten the time of conveying the wafer between the processing chambers.

A polarity of a voltage applied to the electrode may be changed after transferring the wafer from the holding surface to the supporting surface and before transferring the wafer from the supporting surface to the holding surface.

As a result, it is possible to unelectrify the holding surface, and to properly hold the wafer.

A wafer conveyance system according to an embodiment of the present invention includes a conveyance robot, a supporting surface, and a controller.

The conveyance robot includes a holding surface having an electrode for electrostatic attraction.

The supporting surface supports a wafer.

The controller is capable of carrying out an operation control for moving the holding surface relative to the supporting surface, and a control for supplying a voltage to the electrode, and is configured to cause the conveyance robot to transfer the wafer from the supporting surface to the holding surface while a voltage is applied to the electrode.

Because of this, the wafer may be held by means of an electrostatic attraction force immediately after the wafer is moved to the holding surface, whereby it is possible to convey the wafer rapidly. As a result, it is possible to shorten the time of conveying the wafer between the processing chambers.

The controller may cause the conveyance robot to transfer the wafer to the supporting surface while the holding surface electrostatically attracts the wafer.

As a result, it is possible to further shorten the time of conveying the wafer between the processing chambers.

The controller may change a polarity of a voltage applied to the electrode after the conveyance robot transfers the wafer from the holding surface to the supporting surface and before the conveyance robot transfers the wafer from the supporting surface to the holding surface.

As a result, it is possible to unelectrify the holding surface, and to properly hold the wafer.

Hereinafter, an embodiment of the present invention will be described with reference to the drawings.

Figure 1:
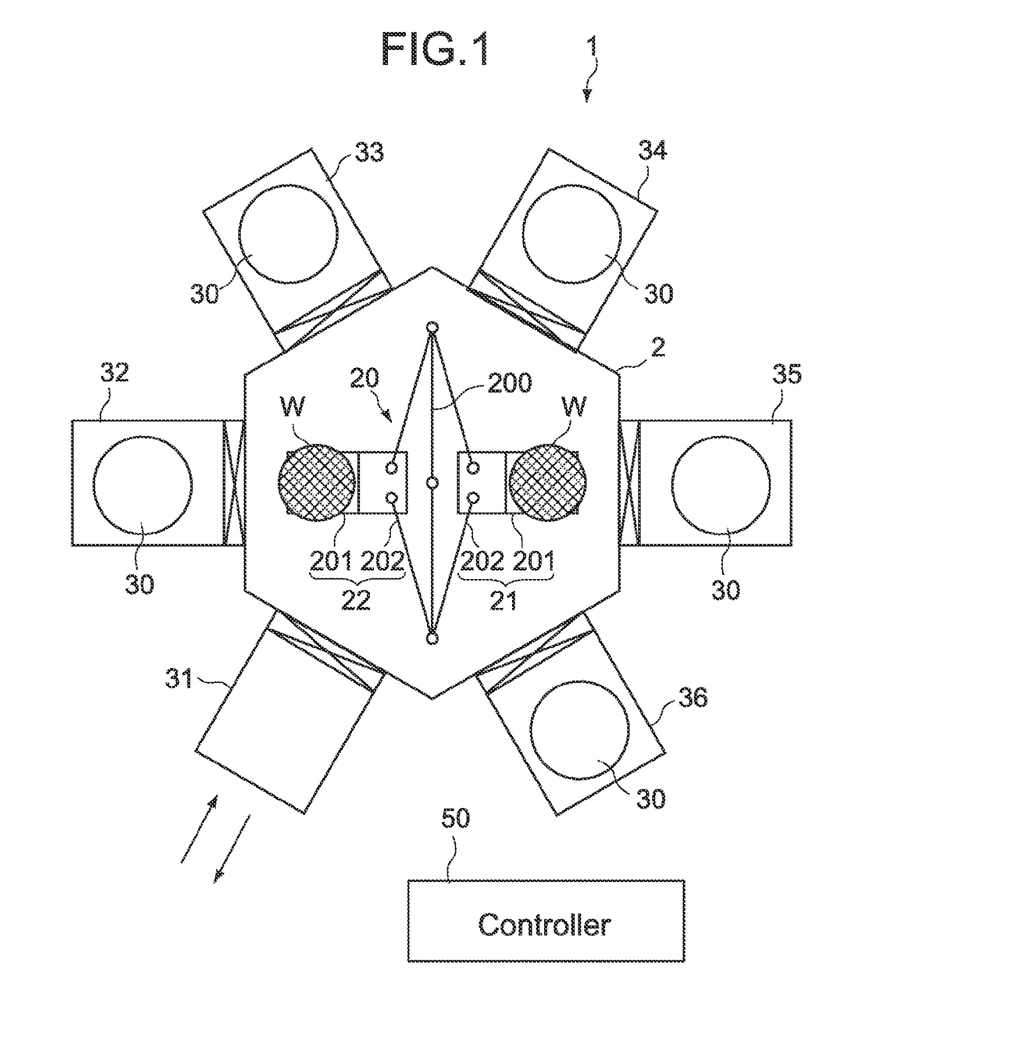
FIG. 1 A schematic plan view of a vacuum processing apparatus, to which a wafer conveyance system according to an embodiment of the present invention is applied.

FIG. 1 is a schematic plan view showing a vacuum processing apparatus, to which a wafer conveyance system according to an embodiment of the present invention is applied. A vacuum processing apparatus 1 is a multi-chamber vacuum processing apparatus, and includes a conveyance chamber 2 and a plurality of processing chambers 31 to 36, which are around the conveyance chamber 2 and connected to the conveyance chamber 2 via gate valves, respectively. The conveyance chamber 2 and the processing chambers 31 to 36 are connected to evacuation lines, respectively, and are capable of being evaluated individually.

A wafer conveying apparatus 20 is mounted on the conveyance chamber 2. The wafer conveying apparatus 20 includes a first conveyance robot 21 and a second conveyance robot 22. Each of the first and second conveyance robots 21, 22 is capable of expanding, contracting, rotating, and moving up and down, and has a function of conveying a wafer W between the plurality of processing chambers.

The first and second conveyance robots 21, 22 include a pair of shared arm units 200, a pair of operation arm units 202, and hand units 201. One ends of the shared arm units 200 are connected to a not-shown drive source, and the other ends are commonly connected to the operation arm units 202 of the conveyance robots 21, 22. The hand unit 201 is mounted on a head of the operation arm unit 202, and supports the back surface of the conveyance-target wafer W. Typically, the wafer W is a semiconductor wafer, but is not limited to this.

The processing chambers 31 to 36 are independent vacuum chambers, and perform predetermined vacuum processing on the wafer W, respectively. For example, the processing chamber 31 is a chamber for loading/unloading the wafer W, and the other processing chambers 32 to 36 are film-forming chambers (sputtering chamber or CVD chamber), a thermal processing chamber, and the like, respectively. Allocation of vacuum processing to the processing chambers 32 to 36 is not specifically limited, and is arbitrarily determined according to vacuum processing applied to the wafer W. A stage 30 (processing stage) for supporting the wafer W is provided on each of the processing chambers 32 to 36.

Figure 2:
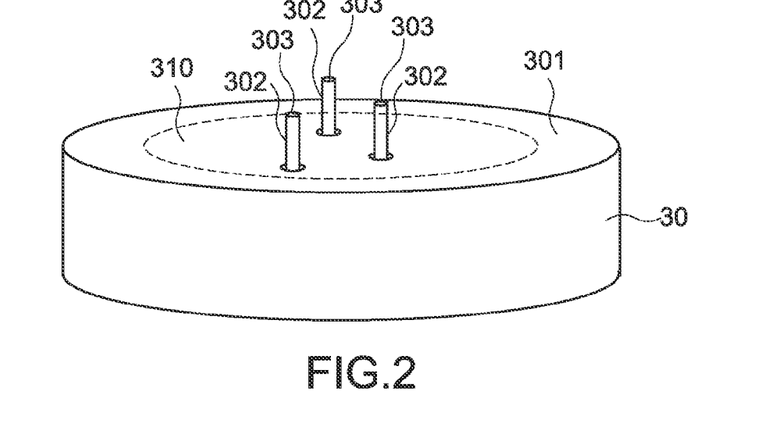
FIG. 2 A perspective view showing a schematic structure of a stage of the vacuum processing apparatus.

FIG. 2 is a perspective view showing a schematic structure of the stage 30. The stage 30 includes a stage surface 301 for holding the wafer W, and a plurality of hoist pins 302 (support member). As shown in FIG. 2, the hoist pin 302 is capable of moving up and down between an up position, at which a supporting surface 303 at the tip is projected from the stage surface 301, and a down position, at which the supporting surface 303 is below the stage surface 301. As will become apparent below, a series of operations of delivering/receiving the wafer W between the conveyance robots 21, 22 and the stage 30 includes the steps of protruding the hoist pins 302 from the stage surface 301 as shown in FIG. 2, and supporting the back surface of the wafer W by the supporting surfaces 303 at the tips of the hoist pins 302.

Note that the stage 30 may include an electrostatic chuck area 310 on the stage surface 301. With this structure, the posture of the wafer W may be held on the stage surface 301. Further, the back surface of the wafer W may be in close contact with the stage surface 301 because of an electrostatic attraction force, whereby it is possible to cool the back surface of the wafer by using a coolant gas.

Figure 3:
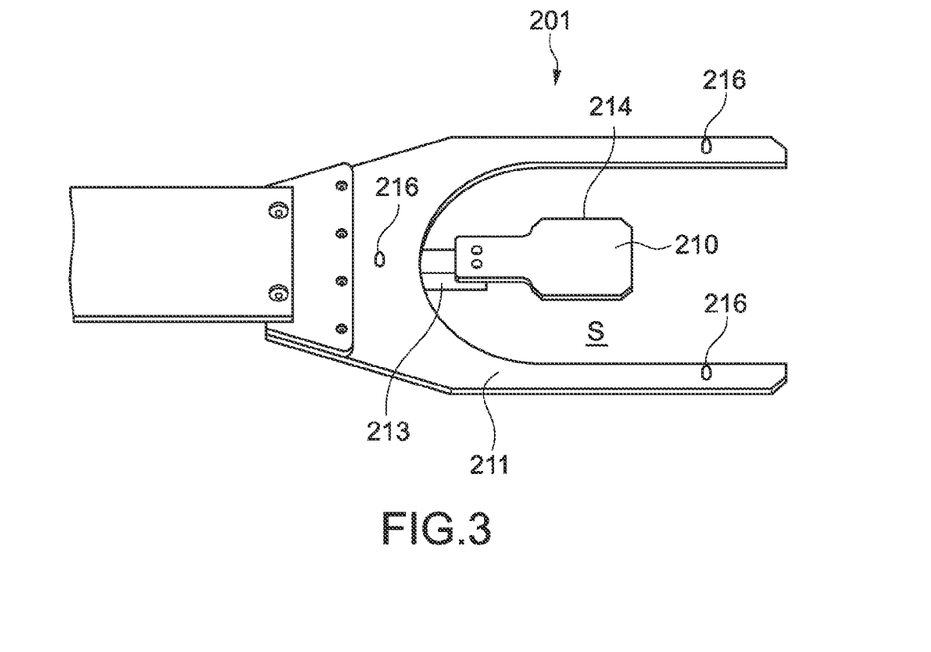
FIG. 3 A perspective view showing a hand unit of a conveyance robot of the vacuum processing apparatus.

Subsequently, FIG. 3 is a perspective view showing one structural example of the hand unit 201 of each of the first and second conveyance robots 21, 22. The hand unit 201 includes a main unit 211 and an electrostatic chuck member 214.

The main unit 211 is formed of, for example, a ceramic material such as alumina or stainless steel, and has a fork shape having a void space S at the center. The electrostatic chuck member 214 is mounted on the main unit 211 via a fixing member 213 such that the electrostatic chuck member 214 is approximately at the center of the void space S. The electrostatic chuck member 214 has a rectangular plate shape, and has, on its top surface, a holding surface 210 for supporting the back surface of the wafer W.

Figure 4:
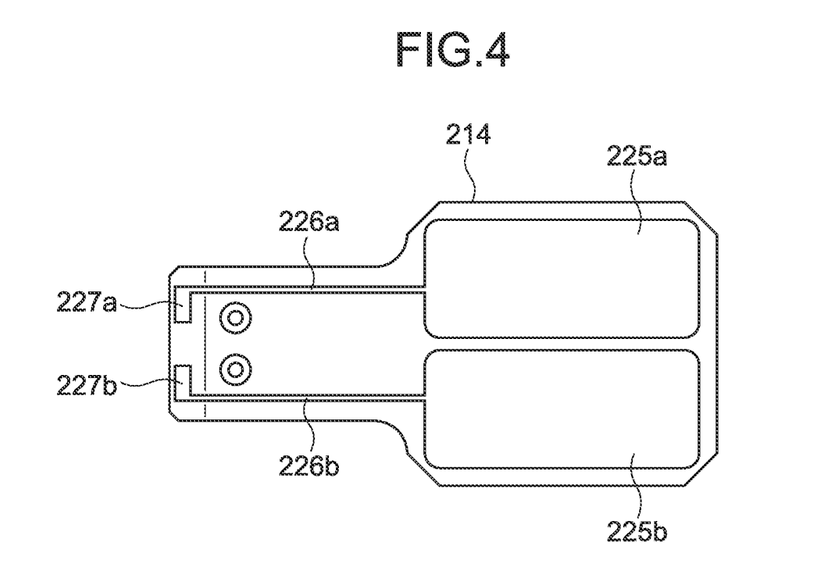
FIG. 4 A plan view of an electrostatic chuck member, which is a holding surface of the hand unit.

FIG. 4 is a plan view showing a structural example of the electrostatic chuck member 214. The electrostatic chuck member 214 has a structure in which an electrode pattern is sandwiched between insulating resin sheets made of polyimide or the like. The electrode pattern includes a pair of electrode sections 225a, 225b, to each of which voltage is applied and each of which generates an electrostatic attraction force, terminal sections 227a, 227b, which are connected to a not-shown voltage source, and wiring sections 226a, 226b, which connect the electrode sections 225a, 225b and the terminal sections 227a, 227b, respectively. Voltages (chucking voltages) having different polarities are applied to the electrode sections 225a, 225b, respectively. The amounts of the chucking voltages are not specifically limited, and are, for example, plus or minus 100 to plus or minus 700 V. Note that the electrode pattern may not be bipolar as shown in FIG. 4, but may be monopolar.

The hand unit 201 of this embodiment further includes a plurality of support pins 216, which support the rim of the back surface of the wafer W held by the holding surface 210. The support pins 216 are provided on appropriate positions on the upper surface of the main unit 211. The positions, heights, and number of the support pins 216 are not specifically limited, and are set in consideration of the size of the wafer W, the permissible curving amount of the wafer W, and the like.

The support pins 216 may elastically move up and down from the upper surface of the main unit 211. In this case, the main unit 211 has a plurality of holes for accommodating the support pins 216, respectively, and an elastic member such as a spring is provided between the bottom of each hole and the lower end of the support pin 216. Because of this structure, the protrusion heights of the support pins 216 are changed, whereby the support pins 216 may always support the back surface of the wafer W properly. Because of this, for example, in a case where the wafer W is deformed, e.g., curved, the hand unit 201 may convey the wafer W in a stable posture.

The vacuum processing apparatus 1 of this embodiment further includes a controller 50. The controller 50 is a computer, and controls overall operations of the vacuum processing apparatus 1 including operations of exhausting the conveyance chamber 2 and the processing chambers 30 to 36, operations of the wafer conveying apparatus 20, operations of opening/closing the gate valves, and the like. Further, the controller 50 controls operations of the wafer conveying apparatus 20 necessary to convey the wafer W between the processing chambers, that is, expansion, contraction, rotation, and up and down movements of the conveyance robots 21, 22, operations for electrostatically attracting the holding surface 210 by the hand unit 201, up and down movements of the hoist pins 302 of the stage 30, and the like.

Next, examples of operations of the vacuum processing apparatus 1 will be described.

With reference to FIG. 1, the vacuum processing apparatus 1 conveys the wafers W loaded on the loading/unloading chamber 31 to the predetermined processing chamber 32 to 36 via the wafer conveying apparatus 20 one by one in a predetermined sequence, and applies predetermined vacuum processing to the wafers W. The wafer conveying apparatus 20 conveys the wafer W, to which predetermined vacuum processing has been applied, to the loading/unloading chamber 31, and then the wafer W is conveyed from the loading/unloading chamber 31 to the outside of the apparatus.

In the vacuum processing apparatus 1 of this embodiment, because the wafer conveying apparatus 20 includes the first and second conveyance robots 21, 22, the hand units 201 thereof are capable of holding the two wafers W at the same time, and capable of conveying the wafers W to the predetermined processing chambers 31 to 36, respectively. Because of this, the wafer processing efficiency of the vacuum processing apparatus 1 may be increased.

Figure 5:
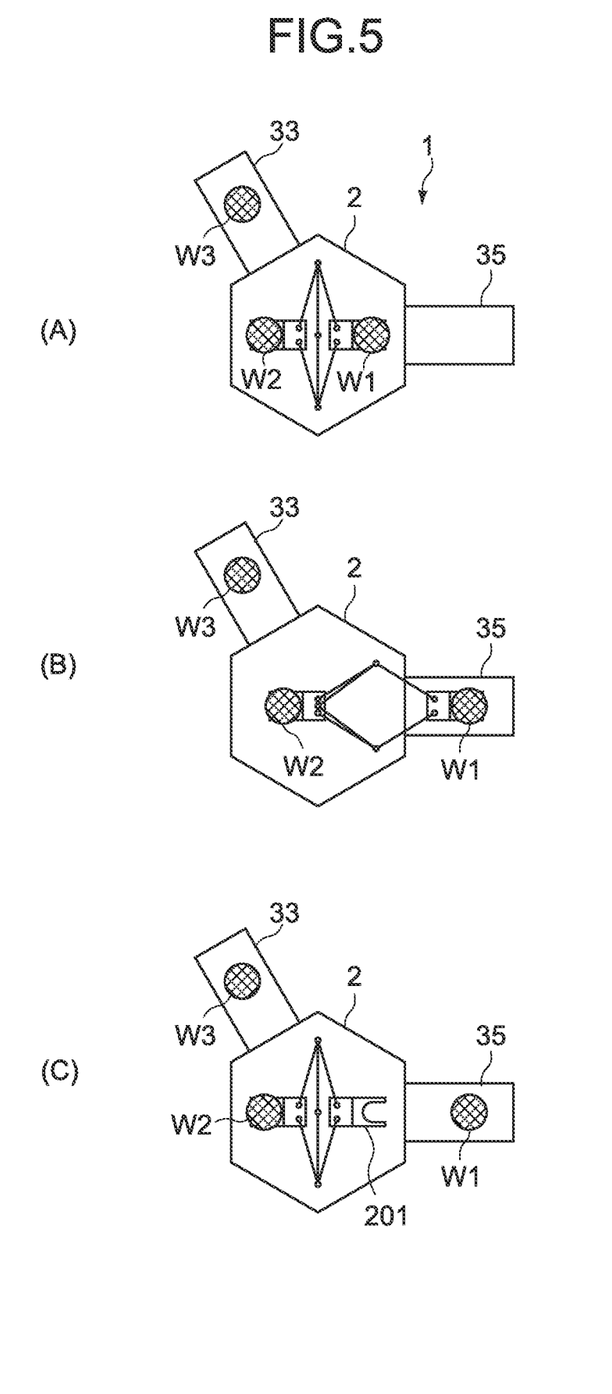
FIG. 5 Schematic plan views for explaining the series of steps of conveying wafers by the vacuum processing apparatus.
Figure 6:
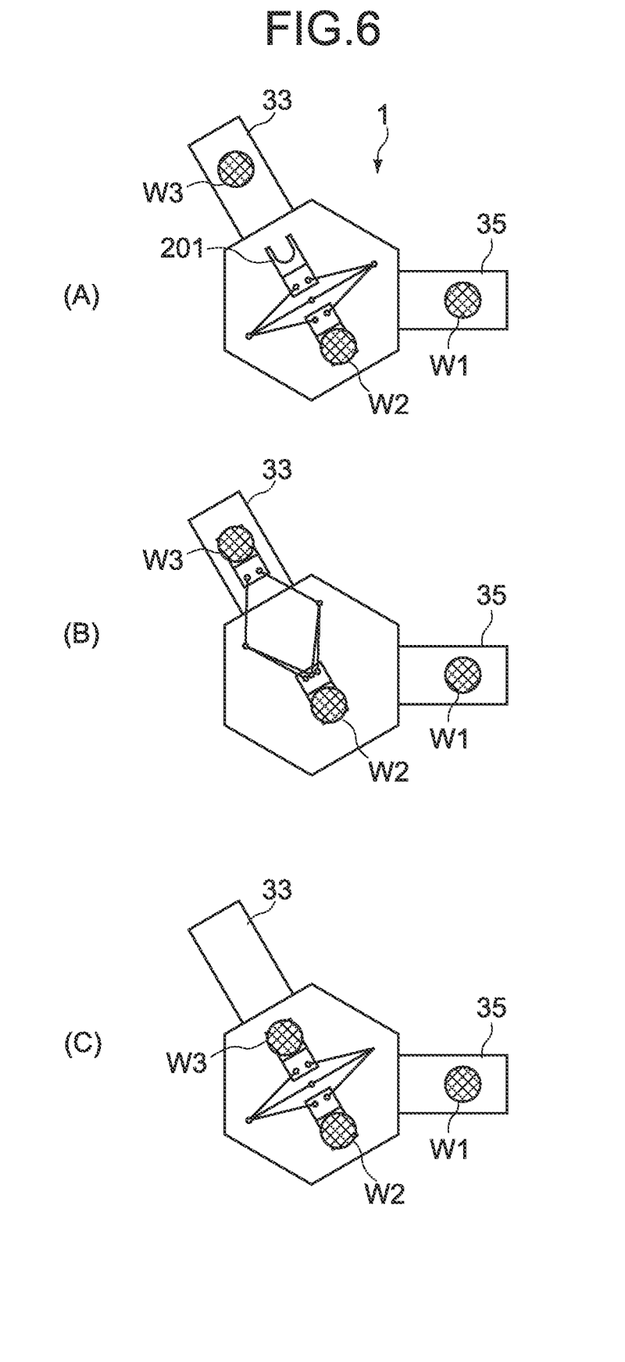
FIG. 6 Schematic plan views for explaining the series of steps of conveying wafers by the vacuum processing apparatus.
Figure 7:
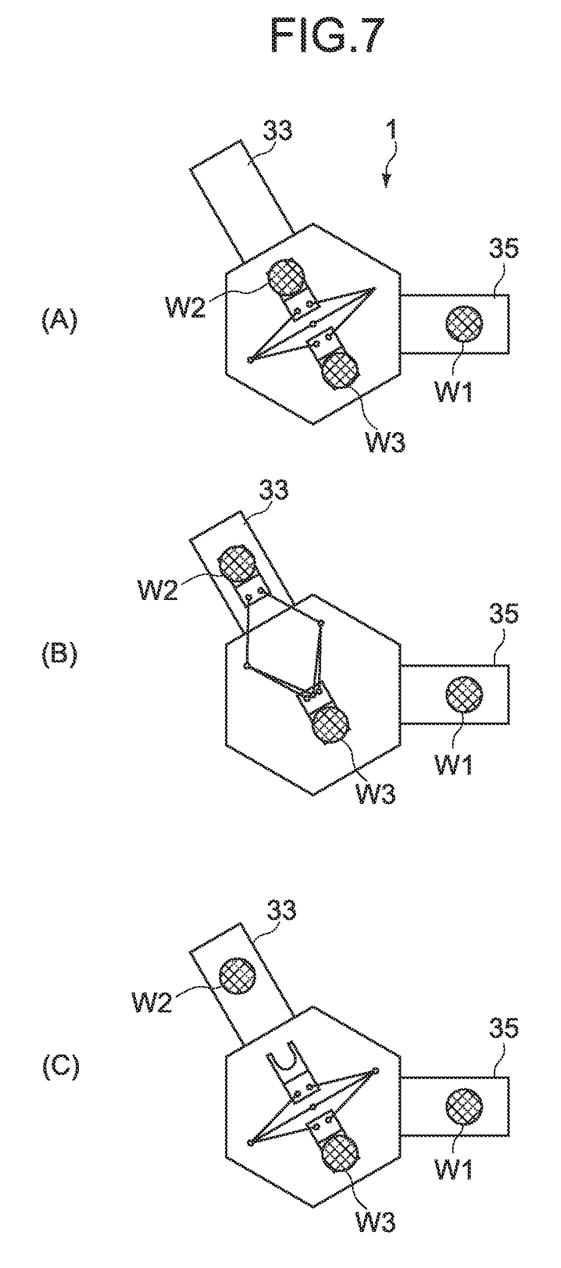
FIG. 7 Schematic plan views for explaining the series of steps of conveying wafers by the vacuum processing apparatus.

Hereinafter, an example of a method of conveying wafers between a plurality of processing chambers will be described. FIG. 5 to FIG. 7 show the procedure of delivering/receiving wafers W1 to W3 between the wafer conveying apparatus 20, and the processing chamber 33 and the processing chamber 35. FIG. 5(A) shows a state where the wafer conveying apparatus 20 holds the first wafer W1 and the second wafer W2, and the third wafer W3 is mounted on the stage of the processing chamber 33. Here, a case where the processing chamber 35 processes the first wafer W1, the processing chamber 33 processes the second wafer W2, and the third wafer W3 processed by the processing chamber 33 is conveyed to another processing chamber will be described as an example.

Note that, to facilitate understanding, in FIG. 5 to FIG. 7, illustration of the processing chambers other than the processing chamber 33 and the processing chamber 35 will be omitted. Further, in the following description, illustration of the gate valves for separating the processing chambers and the conveyance chamber will be omitted, and description of operations of opening/closing the gate valves will be omitted.

As shown in FIGS. 5(B) and (C), the controller 50 expands and contracts the arm units of the wafer conveying apparatus 20, to thereby convey the first wafer W1 from the conveyance chamber 2 to the processing chamber 35. The processing chamber 35 applies predetermined vacuum processing to the first wafer W1. Next as shown in FIG. 6(A), the controller 50 rotates the wafer conveying apparatus 20 by a predetermined angle, whereby the hand unit 201, which has released the first wafer W1, faces the processing chamber 33. Subsequently as shown in FIGS. 6(B) and (C), the controller 50 expands and contracts the arm units of the wafer conveying apparatus 20, to thereby convey the third wafer W3 from the processing chamber 33 to the conveyance chamber 2. Next as shown in FIG. 7(A), the controller 50 rotates the wafer conveying apparatus 20 by 180°, whereby the second wafer W2 faces the processing chamber. Then as shown in FIGS. 7(B) and (C), the controller 50 expands and contracts the arm units of the wafer conveying apparatus 20, to thereby convey the second wafer W2 from the conveyance chamber 2 to the processing chamber 33. The processing chamber 33 applies predetermined vacuum processing on the second wafer W2.

Figure 8:
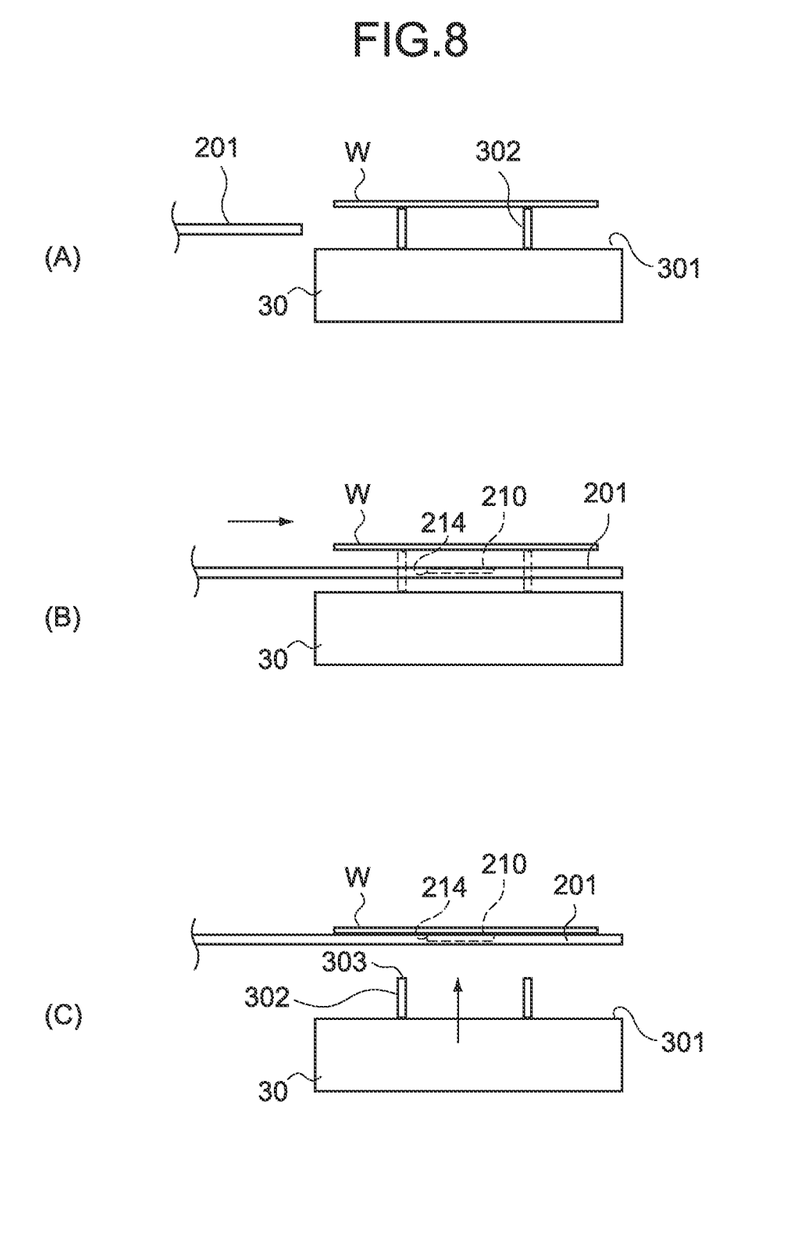
FIG. 8 Schematic side views showing the step of transferring a wafer from the stage to a hand unit of the conveyance robot.

Next, with reference to FIG. 8 and FIG. 9, the steps of delivering/receiving the wafer W to/from the stage 30 of the processing chamber will be described. FIG. 8 are schematic side views showing the step of transferring the wafer W from the stage 30 to the hand unit 201 of the conveyance robot, and FIG. 9 are schematic side views showing the step of transferring the wafer W from the hand unit 201 to the stage 30.

In the case of transferring the wafer W from the stage 30 to the hand unit 201, as shown in FIG. 8(A), the controller 50 causes the hoist pins 302 to protrude from the stage surface 301, to thereby raise the wafer W above the stage surface 301. In this case, the supporting surfaces 303 at the tips of the hoist pins 302 support the wafer W. Next as shown in FIG. 8(B), the controller 50 moves the hand unit 201 to the vicinity of the wafer W, i.e., between the wafer W and the stage surface 301 in this embodiment, whereby the center section of the back surface of the wafer W faces the electrostatic chuck member 214. Then as shown in FIG. 8(C), the controller 50 raises the hand unit 201 by a predetermined distance.

As described above, the wafer W is transferred from the stage surface 301 of the stage 30 to the holding surface 210 of the hand unit 201. In this embodiment, when mounting the wafer, which has been mounted on the stage 30, on the hand unit 201, the controller 50 previously applies chucking voltages to the electrode sections 225a, 225b of the electrostatic chuck member 214 of the hand unit 201, and the wafer W is transferred to the holding surface 210 while the voltages are being applied. Because of this, the wafer W may be held by means of an electrostatic attraction force immediately after the wafer W is moved to the holding surface 210, whereby it is possible to convey the wafer W rapidly.

Figure 9:
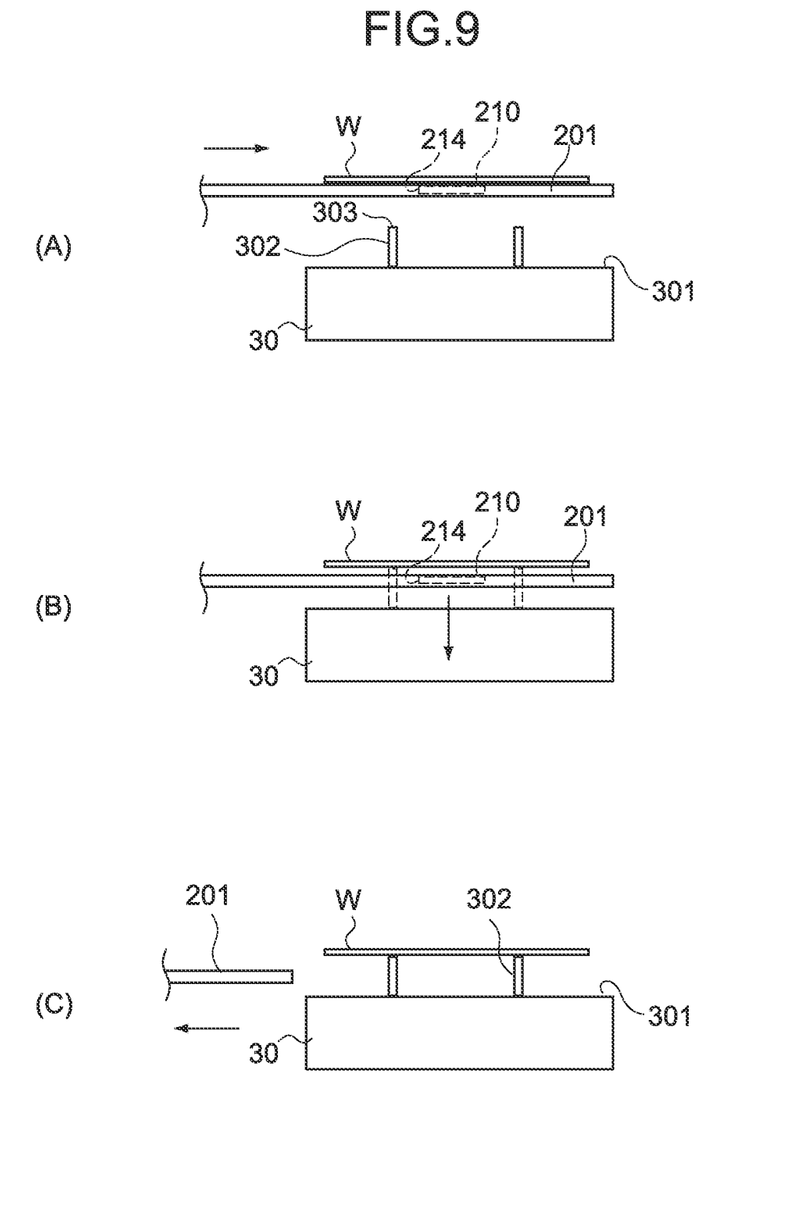
FIG. 9 Schematic side views showing the step of transferring a wafer from the hand unit of the conveyance robot to the stage.

Next, in the case of transferring the wafer W from the hand unit 201 to the stage 30, as shown in FIG. 9(A), the controller 50 conveys the hand unit 201 to a position directly above the stage surface 301 of the stage 30. In this case, the chucking voltages are applied to the electrode sections 225a, 225b of the electrostatic chuck member 214, and the holding surface 210 electrostatically attracts the wafer W. Meanwhile, the controller 50 causes the hoist pins 302 to protrude from the stage surface 301. Next as shown in FIG. 9(B), the controller 50 lowers the hand unit 201 by a predetermined distance, to thereby mount the wafer W, which has been mounted on the hand unit 201, on the supporting surfaces 303 at the tips of the hoist pins 302. Then as shown in FIG. 9(C), the controller 50 laterally moves the hand unit 201 from the position directly above the stage surface 301. Then, the hoist pins 302 is lowered, and the stage surface 301 holds the wafer W.

As described above, the wafer W is transferred from the holding surface 210 of the hand unit 201 to the stage surface 301 of the stage 30. In this embodiment, in the case of mounting the wafer W, which has been mounted on the hand unit 201, on the stage 30, the controller 50 does not cut off the supply of the chucking voltages to the electrode sections 225a, 225b of the electrostatic chuck member 214. That is, the controller 50 transfers the wafer W from the holding surface 210 to the supporting surfaces 303 of the hoist pins 302 while the holding surface 210 keeps electrostatically attracting the wafer W. As a result, it is possible to omit the time to lose an electrostatic attraction force applied to the wafer W, which is required for the method of transferring the wafer W after cutting off an electrostatic attraction force supplied to the holding surface 210, whereby it is possible to transfer the wafer rapidly.

Figure 10:
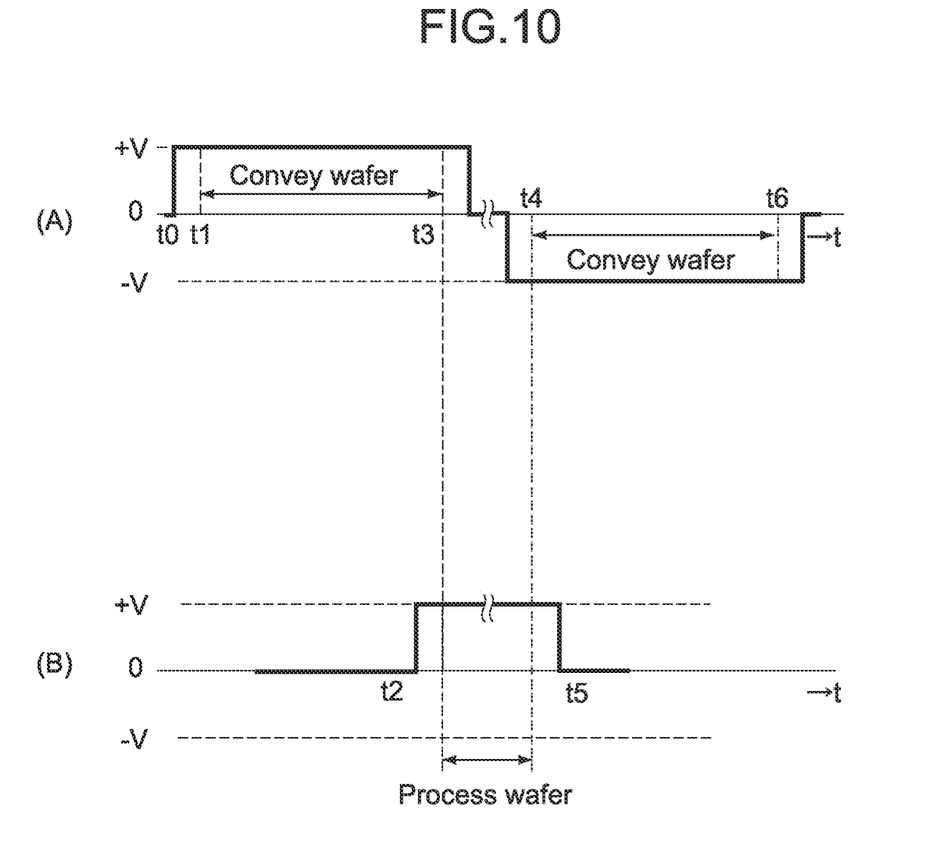
FIG. 10 Timing charts showing examples of the supply of chucking voltages to the electrostatic chuck member, and to an electrostatic chuck area provided on the stage.

FIG. 10(A) shows an example of timings of application of the chucking voltage to the electrostatic chuck member 214, which is applied to the above-mentioned step of transferring the wafer W. The chucking voltage "+V" is applied at the timing t0, and after that the wafer W is mounted on the holding surface 210 at the timing t1 (FIG. 8(C)). The time period "t0 to t1" is a time period in which an enough electrostatic attraction force is generated on the holding surface 210, and is, for example, about 5 seconds. Because of this, it is possible to convey the wafer W rapidly, after transferring the wafer W to the holding surface 210. The wafer W is transferred to the stage in the other processing chamber, which is a conveyance target, between the timing t1 to the timing t3. At the timing t3, the wafer W is mounted on the supporting surfaces 303 at the tips of the hoist pins 302, while an electrostatic attraction force generated by the holding surface 210 is being applied to the wafer W (FIG. 9(C)).

The polarity of the chucking voltage may be changed after conveying the wafer to one processing chamber and before receiving a wafer from another processing chamber. That is, as shown in FIG. 10(A), the polarity of the chucking voltage is inverted after the wafer W is released at the timing t3 and before the wafer W is received at the timing t4. Then, the wafer W is conveyed to another processing chamber, which is a conveyance target, between the timing t4 and the timing t6, while the chucking voltage having the inverted polarity is maintained. As a result, it is possible to keep on properly delivering/receiving the wafer W while the holding surface 210 of the hand unit 201 is kept unelectrified.

Meanwhile, FIG. 10(B) shows the timing of application of voltage to the electrostatic chuck area 310 in the case where the stage surface 301 of the stage 30 has the electrostatic chuck area 310 (FIG. 2). In the example shown in FIG. 10(B), the controller 50 generates an electrostatic attraction force on the electrostatic chuck area 310 at the timing t2, which is before the timing t3 at which the wafer W is transferred from the holding surface 210 of the hand unit 201. As a result, the stage surface 301 is capable of holding the wafer W immediately after transferring the wafer W from the holding surface 210 to the stage surface 301, whereby it is possible to process the wafer rapidly. Further, as shown in FIG. 10(B), the electrostatic attraction force of the electrostatic chuck area 310 may be lost at the timing t5, which is after the timing t4 at which the wafer W is transferred from the stage 30 to the hand unit 201. As a result, it is possible to omit the time to lose an electrostatic attraction force applied to the wafer W, which is required for the method of transferring the wafer W after cutting off an electrostatic attraction force supplied to the stage surface 301, whereby it is possible to transfer the wafer rapidly.

Here, the polarity of the voltage applied to the electrostatic chuck area 310 is inverted after the timing t5, whereby the stage surface 301 may be unelectrified. Further, the force of attracting the wafer W by the electrostatic chuck area 310 is set to an amount at which the wafer W does not crack and the like when the hoist pins 302 raise the wafer W above the stage surface 301. Alternatively, when the hoist pins 302 raise the wafer W, the attraction force of the electrostatic chuck area 310 may be lowered.

As described above, according to the wafer conveyance method of this embodiment, the wafer W is transferred from the supporting surface 303 to the holding surface 210 while electrostatic attraction forces are generated on the holding surfaces 210 of the conveyance robots 21, 22. Because of this, the wafer W may be held by means of an electrostatic attraction force immediately after the wafer W is moved to the holding surface 210, whereby it is possible to convey the wafer W rapidly. As a result, it is possible to shorten the time of conveying the wafer W between the processing chambers.

Further, in this embodiment, the wafer W is transferred to the supporting surface 303 while the holding surface 210 electrostatically attracts the wafer W. According to this method, it is possible to transfer the wafer W from the holding surface 210 to the supporting surface 303 without losing the positional accuracy of the wafer W. As a result, it is possible to further shorten the time of conveying the wafer W between the processing chambers.

According to an experiment carried out by the inventors of the present invention, under the condition in which a silicon wafer 300 mm in diameter (140 g) is used as the wafer W, the area of the holding surface 210 is 40 cm$^2$, and the chucking voltage is 500 V, it is confirmed that the displacement amount of the wafer is equal to or smaller than 0.025 mm. Further, in this case, the pressure in the processing chamber is 6×10$^{-3}$ Pa, and it is confirmed that there is no discharge between the wafer and the holding surface when transferring the wafer. Further, under the wafer-conveyance conditions shown in FIG. 5 to FIG. 7, it is confirmed that the operating time of the conveyance robot is shortened by 5 seconds or more, compared to the case where the wafers are transferred in the state where the electrostatic attraction force of the hand units are cut off.

Although the embodiment of the present invention has been described above, the present invention is not limited to this, and may be variously modified based on the technical thoughts of the present invention.

For example, although the wafer conveying apparatus includes the two conveyance robots in the example of the above embodiment, the embodiment is not limited to this, and may include a single conveyance robot. Further, the structure of the electrostatic chuck member applied to the hand unit of the conveyance robot is not limited to the above-mentioned example.

Further, although the vacuum processing apparatus for conveying wafers under the vacuum environment is described as an example of the wafer conveyance system in the above embodiment, is possible to apply the present invention to the conveyance system for conveying wafers in the atmosphere.

Further, although the hoist pins are employed as a support member for transferring a wafer to the holding surface of the conveyance robot in the example of the above embodiment, the support member is not limited to this, and may be a wafer cassette capable of accommodating a plurality of wafers, for example. In this case, a supporting surface capable of supporting a wafer is an upper surface of a shelf which is formed in a cassette and is capable of supporting the rim of a wafer.

DESCRIPTION OF SYMBOLS 1 vacuum processing apparatus
2 conveyance chamber
21, 22 conveyance robot
30 stage
30 to 36 processing chamber
201 hand unit
210 holding surface
214 electrostatic chuck member
225a, 225b electrode section
301 stage surface
302 hoist pin
303 supporting surface

The invention claimed is:

1. A wafer conveyance method, comprising:
   moving a holding surface of a conveyance robot having an electrode for electrostatic attraction to the vicinity of a wafer supported by a supporting surface of a support member;
   raising at least a portion of the supporting surface to elevate the wafer above a stage of the support member; and
   transferring the wafer from the raised supporting surface to the holding surface while applying a voltage to the electrode.

2. The wafer conveyance method according to claim 1, further comprising
   transferring the wafer back to the supporting surface while the holding surface electrostatically attracts the wafer.

3. The wafer conveyance method according to claim 2, wherein
   a polarity of a voltage applied to the electrode is changed after transferring the wafer from the holding surface to the supporting surface and before transferring the wafer from the supporting surface to the holding surface.

4. The wafer conveyance method according to claim 1, wherein the applied voltage is not cut off while the wafer is transferred from the supporting surface to the holding surface.

5. The wafer conveyance method according to claim 1, wherein the support member further comprises hoist pins, wherein at least a portion of the support surface is disposed on tips of the hoist pins, and wherein raising at least a portion of the supporting surface to elevate the wafer above a stage of the support member comprises protruding the hoist pins upward from the stage.

6. A wafer conveyance system, comprising:
   a conveyance robot including a holding surface having an electrode for electrostatic attraction;
   a support member comprising a stage and a supporting surface for supporting a wafer; and
   a controller configured to carry out an operation control for moving the holding surface relative to the supporting surface, an operation control for raising at least a portion of the supporting surface to elevate the wafer above the stage of the support member, and an operation control for supplying a voltage to the electrode, and configured to cause the conveyance robot to transfer the wafer from the raised supporting surface to the holding surface while a voltage is applied to the electrode.

7. The wafer conveyance system according to claim 6, wherein
   the controller the conveyance robot to transfer the wafer back to the supporting surface while the holding surface electrostatically attracts the wafer.

8. The wafer conveyance system according to claim 7, wherein
   the controller changes a polarity of a voltage applied to the electrode after the conveyance robot transfers the wafer from the holding surface to the supporting surface and before the conveyance robot transfers the wafer from the supporting surface to the holding surface.

9. The wafer conveyance system according to claim 6, wherein
   the conveyance robot includes
   a main unit, and
   a plurality of support pins arranged so as to be capable of elastically moving up and down from the main unit, and configured to be capable of supporting a rim of the wafer.

10. The wafer conveyance system according to claim 6, wherein the controller is configured such that the applied voltage is not cut off while the wafer is transferred from the raised supporting surface to the holding surface.

11. The wafer conveyance system according to claim 6, wherein the support member further comprises hoist pins, wherein at least a portion of the support surface is disposed on tips of the hoist pins, and wherein the control for raising at least a portion of the supporting surface to elevate the wafer above a stage of the support member is a control for protruding the hoist pins upward from the stage.

* * * * *